(12) United States Patent
Kim et al.

(10) Patent No.: US 8,288,223 B2
(45) Date of Patent: Oct. 16, 2012

(54) LAYOUT METHOD OF SEMICONDUCTOR DEVICE WITH JUNCTION DIODE FOR PREVENTING DAMAGE DUE TO PLASMA CHARGE

(75) Inventors: Soo-Young Kim, Gyeonggi-do (KR);
Jong-Hak Won, Gyeonggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/364,362

(22) Filed: Feb. 2, 2012

(65) Prior Publication Data
US 2012/0149160 A1    Jun. 14, 2012

Related U.S. Application Data

(62) Division of application No. 12/047,071, filed on Mar. 12, 2008, now Pat. No. 8,133,778.

(30) Foreign Application Priority Data

Mar. 27, 2007    (KR) .......................... 10-2007-0030043

(51) Int. Cl.
*H01L 21/8234*    (2006.01)

(52) U.S. Cl. ................. 438/237; 257/328; 257/E27.016

(58) Field of Classification Search .................. 438/237; 257/288, 328, E27.016
See application file for complete search history.

(56) References Cited

U.S. PATENT DOCUMENTS
2005/0042806 A1    2/2005    Kimura

FOREIGN PATENT DOCUMENTS
KR    2001-0035990    5/2001
KR    2006-0109758    10/2006

*Primary Examiner* — Thao Le
*Assistant Examiner* — Matthew Gordon
(74) *Attorney, Agent, or Firm* — Muir Patent Consulting, PLLC

(57) ABSTRACT

A layout method of junction diodes for preventing damage caused by plasma charge includes forming an active layer to form a plurality of active regions in a unit layout pattern; forming a gate layer to form a plurality of gate regions on the active regions; forming a first conductive type doping region in at least one of the plurality of active regions within a well layer where a second conductive type well region is formed to form a first conductive type active region; forming a second conductive type doping region in at least one of the plurality of active regions outside of the second conductive type well region to form a second conductive type active region; and forming a second conductive type doping region connected with the gate regions to form a junction diode in at least one active region between the first and second conductive type active regions.

3 Claims, 11 Drawing Sheets

FIG. 4
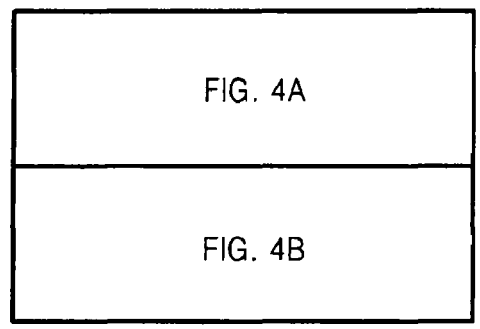
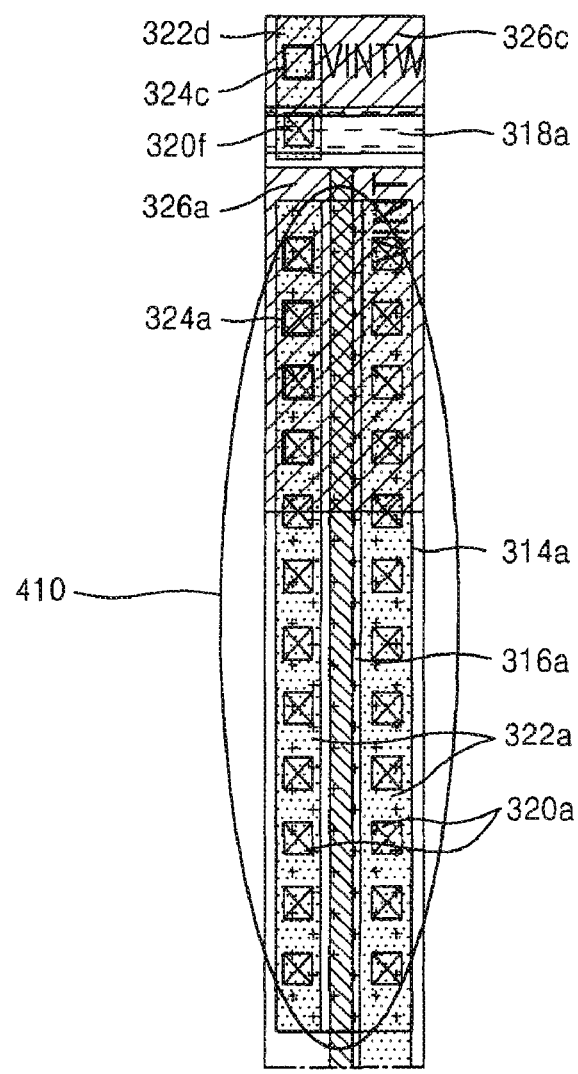
FIG. 4A

| FIG. 6A |
|---------|
| FIG. 6B |

LAYOUT METHOD OF SEMICONDUCTOR DEVICE WITH JUNCTION DIODE FOR PREVENTING DAMAGE DUE TO PLASMA CHARGE

CROSS-REFERENCE TO RELATED PATENT APPLICATION

This application is a Divisional of and claims priority to U.S. patent application No. 12/047,071 filed on Mar. 12, 2008 now U.S. Pat. No. 8,133,778, which claims priority under 35 USC §119 to Korean Patent Application No. 10-2007-0030043, filed on Mar. 27, 2007 in the Korean Intellectual Property Office, the disclosure of each of which is incorporated herein in its entirety by reference.

BACKGROUND

1. Technical Field

The present invention relates to a layout method of a semiconductor device, and more particularly, to a layout method of junction diodes for preventing damage caused by plasma charge.

2. Description of the Related Art

Due to increasing demands for high integration, very small patterns, and high performance semiconductor devices, various plasma processes are typically required in fabricating the semiconductor devices. The various plasma processes can include a dry etching process, a thin film deposition process using a plasma-enhanced chemical vapor deposition (PE-CVD) process, an ashing process, and a blanket etchback process. The dry etching process is generally used in fabricating highly integrated semiconductor devices because the dry etching process has an advantage in that even very small patterns can be processed to have an anisotropic etch characteristic, in comparison with a conventional wet etching process.

However, when the plasma process is applied to fabricate a metal-oxide-semiconductor (MOS) transistor, unequal charge is accumulated in the dry etching process for forming a gate line and a wiring line, or in the ashing process for removing a photosensitive pattern. Accordingly, a gate insulating layer can be damaged (referred to as "plasma damage") due to the plasma charge which migrates to both edge side walls and a surface of a conductive layer forming the gate line or the wiring line. A defect of the semiconductor device caused by the plasma damage is mainly found during use by a customer after sale, whereas other initial defects can be screened in advance of delivery to the customer.

To address the plasma damage problem, a method of disposing a junction diode on a gate pattern has been developed. In other words, by using an NP diode for an N-type metal-oxide-semiconductor (NMOS) transistor and a PN diode for a P-type metal-oxide-semiconductor (PMOS) transistor, the unequal charge caused by the plasma process flows toward a circuit board through the junction diode rather than accumulating in undesired locations.

FIG. 1 illustrates a conventional layout method of a junction diode 150 for minimizing plasma damage. Referring to FIG. 1, for example, the junction diode 150 for minimizing plasma damage is provided in addition to providing a P-type metal-oxide-semiconductor (PMOS) transistor 110 and an N-type metal-oxide-semiconductor (NMOS) transistor 130, thereby forming an inverter circuit. A P-active layer 114a and a gate poly layer 116a included in the PMOS transistor 110 are disposed in an N-well layer 112. Bit poly layers 122a surrounding a contact layer 120a are disposed on the P-active layer 114a included in the PMOS transistor 110. One bit poly layer 122a on the P-active layer 114a connects with a metal layer 126a through a via layer 124a. A power supply voltage (VINT) is applied to the metal layer 126a. Another bit poly layer 122a on the P-active layer 114a connects with one bit poly layer 122b which is connected with an N-active layer 118b through a contact layer 120b which are included in the NMOS transistor 130. The P-active layer 114a forms a P-type doped active region and the N-active layer 118b forms an N-type doped active region.

A metal layer 126c to which a well bias voltage (VINTW) is applied, connects with a bit poly layer 122d through a via layer 124c and the bit poly layer 122d connects with an N-active layer 118a through a contact layer 120d. Thus, the N-active layer 118a forms a well guard ring in the N-well layer 112.

The N-active layer 118b and a gate poly layer 116b are included in the NMOS transistor 130. The bit poly layers 122b surrounding the contact layer 120b are disposed on the N-active layer 118b. Another bit poly layer 122b on the N-active layer 118b connects with a metal layer 126b through a via layer 124b and then connects with a P-active layer 114b through a contact layer 120e. A ground voltage (VSS) is applied to the metal layer 126b. The P-active layer 114b, to which the VSS is applied, forms a P-substrate bias.

The gate poly layers 116a and 116b, respectively included in the PMOS transistor 110 and the NMOS transistor 130, connect with a bit poly layer 122c through a contact layer 120c. The bit poly layer 122c connects with an N-active layer 118c through a contact layer 120f. The N-active layer 118c forms the NP junction diode 150 for preventing damage caused by plasma charge.

FIG. 2 illustrates an example wherein a dummy gate poly layer 116c is disposed in a region close to the gate poly layer 116b when the layout shown in FIG. 1 is disposed uniformly on a substrate. The dummy gate poly layer 116c is used in order to reduce step coverage in a gate poly region when the layout is formed repeatedly. Referring to FIG. 2, the dummy gate poly layer 116c overlaps with the N-active layer 118c forming the junction diode 150 for preventing damage caused by plasma charge, and hereinafter, this overlapped region is defined as region "A". Although region "A" is not a transistor according to design rules, the region "A" may be misrecognized as a transistor region.

Therefore, a layout method of the junction diode 150 for preventing damage caused by plasma charge is needed for the dummy gate poly layer 116c such that it does not overlap with the N-active layer 118c, even though a unit layout is disposed uniformly on a substrate.

SUMMARY

The present invention provides a layout method of junction diodes for preventing damage caused by plasma charge.

According to an aspect of the present invention, there is provided a layout method for a unit layout pattern, the method including: forming an active layer so as to form a plurality of active regions in the unit layout pattern; forming a gate layer so as to form a plurality of gate regions on the active regions; forming a first conductive type doping region in at least one of the plurality of active regions which is within a well layer where a second conductive type well region is formed so as to form a first conductive type active region; forming a second conductive type doping region in at least one of the plurality of active regions which is outside of the second conductive type well region so as to form a second conductive type active region; and forming a second conductive type doping region which is connected with the gate regions so as to form a junction diode in at least one active region between the first and second conductive type active regions.

Accordingly, when laying out a unit layout pattern according to the layout method of the junction diode for preventing damage caused by plasma charge, a dummy gate poly is not required in order to reduce a step coverage in the gate poly region, since the gate poly region is disposed at regular intervals. Further, the width of the unit layout pattern is substantially equal to the widths of the NMOS and PMOS transistors. Therefore, a layout area can be reduced.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
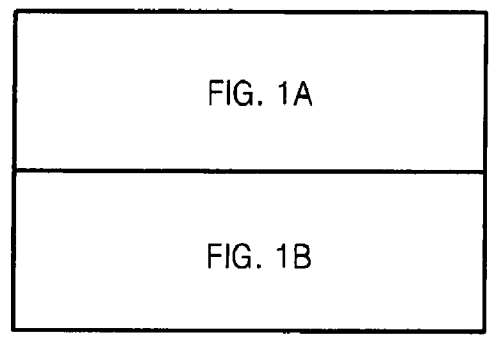
FIG. 1 illustrates a conventional method of laying out a junction diode for preventing damage caused by plasma charge.
Figure 1A:
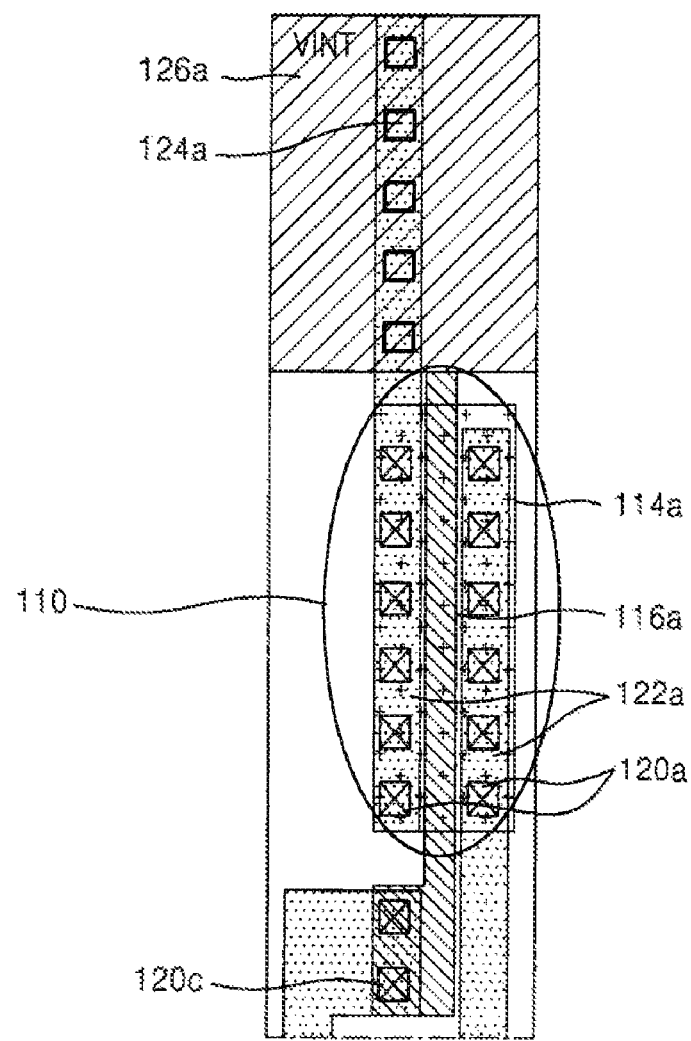
Figure 1B:
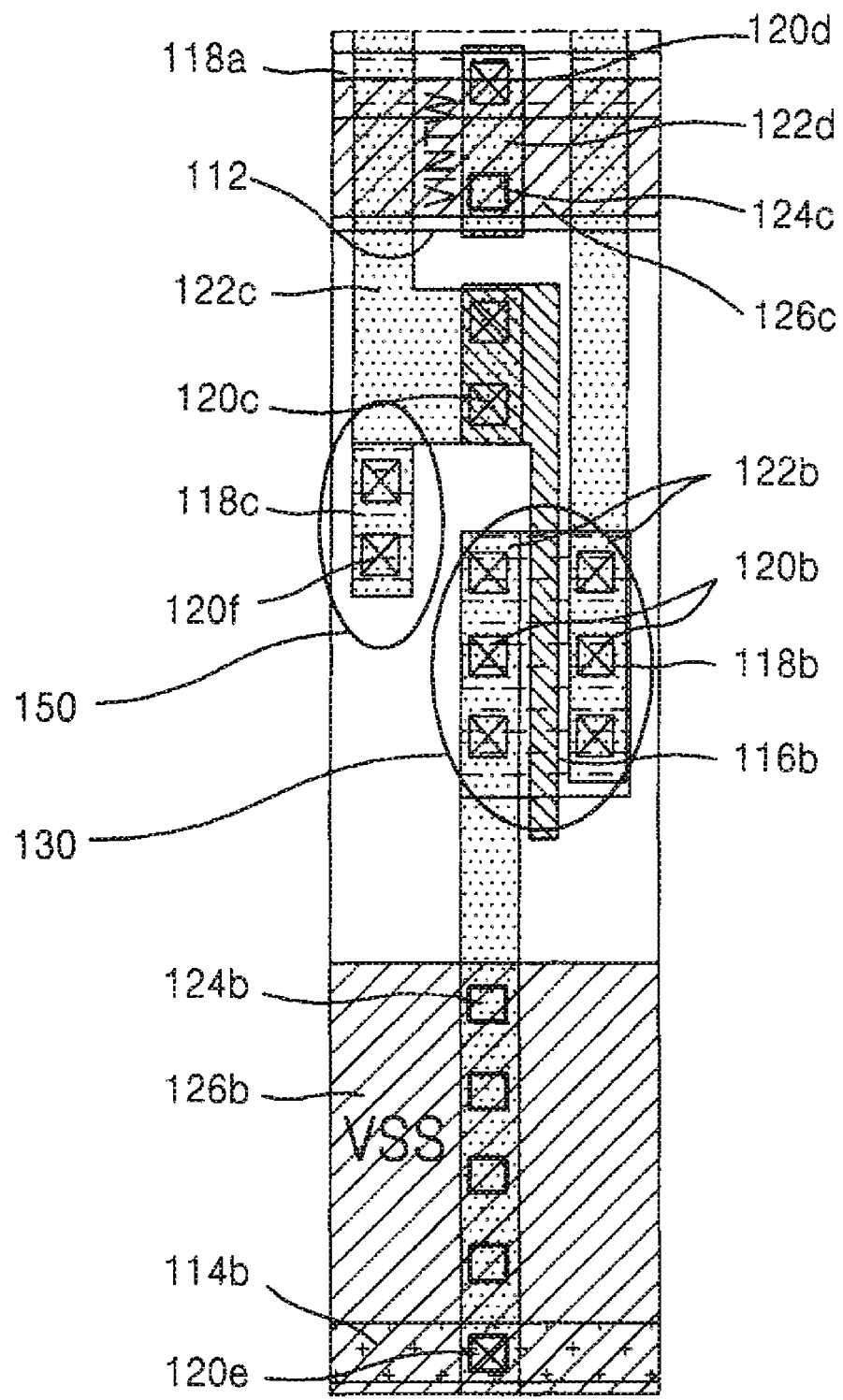
Figure 2:
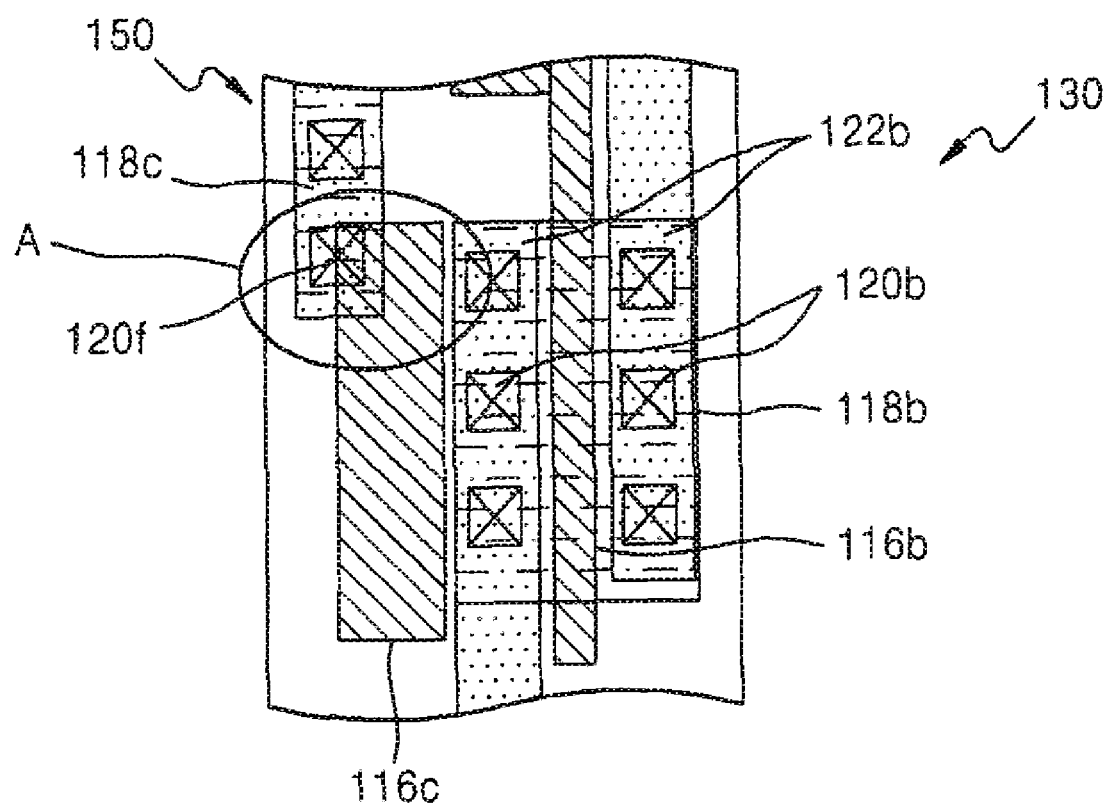
FIG. 2 illustrates an example where a dummy gate poly layer is disposed in order to reduce a step coverage in a gate poly region, in the layout method shown in FIG. 1.

The attached drawings for illustrating exemplary embodiments of the present invention are referred to in order to gain a sufficient understanding of the present invention, the merits thereof, and the objectives accomplished by implementation of the present invention.

Hereinafter, the present invention will be described in detail by explaining exemplary embodiments of the invention with reference to the attached drawings. Like reference numerals in the drawings denote like elements.

Figure 3:
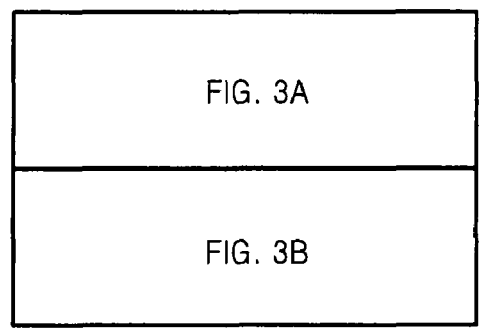
FIG. 3 illustrates a layout method of a junction diode for preventing damage caused by plasma charge according to an embodiment of the present invention.
Figure 3A:
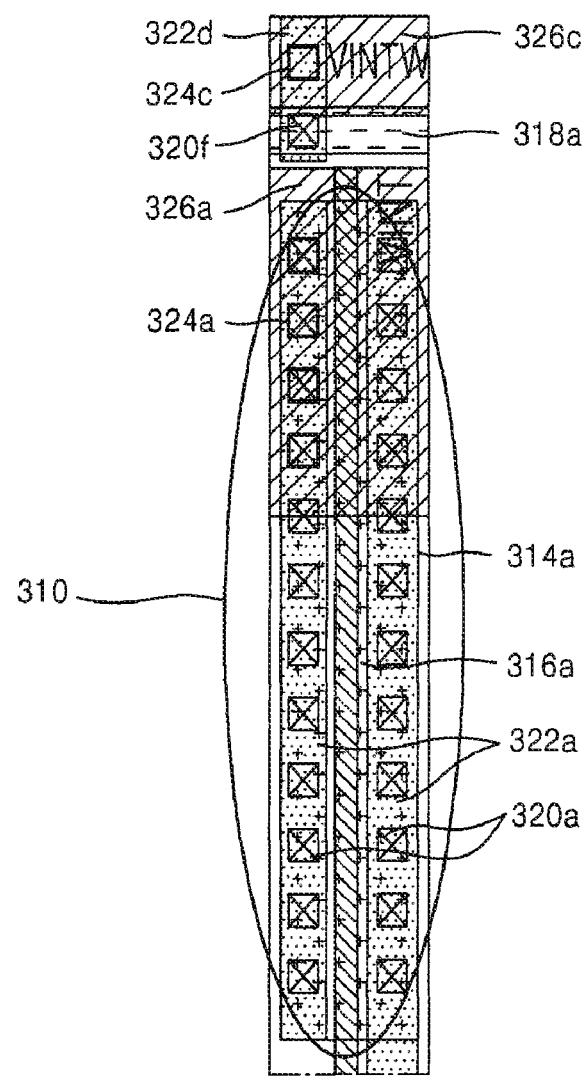
Figure 3B:
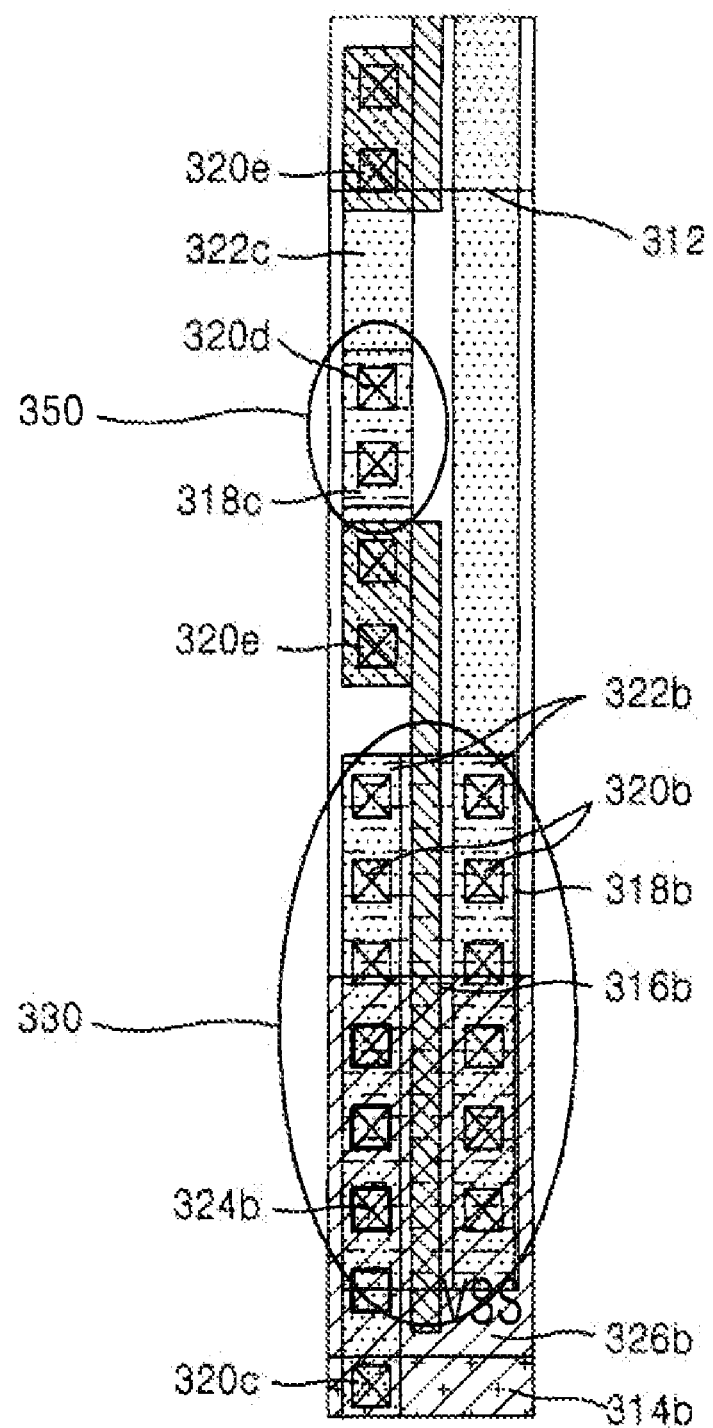

FIG. 3 illustrates a layout method of a junction diode for preventing damage caused by plasma charge according to an embodiment of the present invention. Referring to FIG. 3, a junction diode 350 for preventing damage caused by plasma charge is between gates of a P-type metal-oxide-semiconductor (PMOS) transistor 310 and an N-type metal-oxide-semiconductor (NMOS) transistor 330. A P-active layer 314a and a gate poly layer 316a included in the PMOS transistor 310 are disposed in an N-well layer 312. Bit poly layers 322a surrounding a contact layer 320a are disposed on the P-active layer 314a. One bit poly layer 322a on the P-active layer 314a connects with a metal layer 326a through a via layer 324a. An internal voltage (VINT) is applied to the metal layer 326a. Another bit poly layer 322a on the P-active layer 314a connects with one bit poly layer 322b which is connected with an N-active layer 318b through a contact layer 320b which are included in the NMOS transistor 330.

The N-active layer 318b and a gate poly layer 316b are included in the NMOS transistor 330. The bit poly layers 322b surrounding the contact layer 320b are disposed on the N-active layer 318b. Another bit poly layer 322b on the N-active layer 318b connects with a metal layer 326b through a via layer 324b and then connects with a P-active layer 314b through a contact layer 320c. A ground voltage (VSS) is applied to the metal layer 326b. The P-active layer 314b, to which the VSS is applied, forms a P-substrate bias.

The junction diode 350 for preventing damage caused by plasma charge includes an N-active layer 318c forming an NP diode. The N-active layer 318c connects with a bit poly layer 322c through a contact layer 320d. The bit poly layer 322c connects with the gate poly layer 316a in the PMOS transistor 310 and the gate poly layer 316b in the NMOS transistor 330 through contact layers 320e. Thus, according to some embodiments, the junction diode 350 may be disposed between the NMOS transistor 330 and the PMOS transistor 310.

A metal layer 326c to which a well bias internal voltage (VINTW) is applied, connects with a bit poly layer 322d through a via layer 324c. The bit poly layer 322d connects with an N-active layer 318a through a contact layer 320f and thus the N-active layer 318a forms a well bias in the N-well layer 312.

When laying out a unit layout pattern uniformly across a substrate, according to the layout method of the junction diode shown in FIG. 3, a gate poly region is disposed at regular intervals such that a dummy gate poly is not required to reduce step coverage in the gate poly region. Further, the widths of the N-active layer 318a and P-active layer 314a are substantially equal to the width of the unit layout pattern. Therefore, the layout method of the junction diode for preventing damage caused by plasma charge can reduce the layout area, in comparison to conventional methods.

Figure 4B:
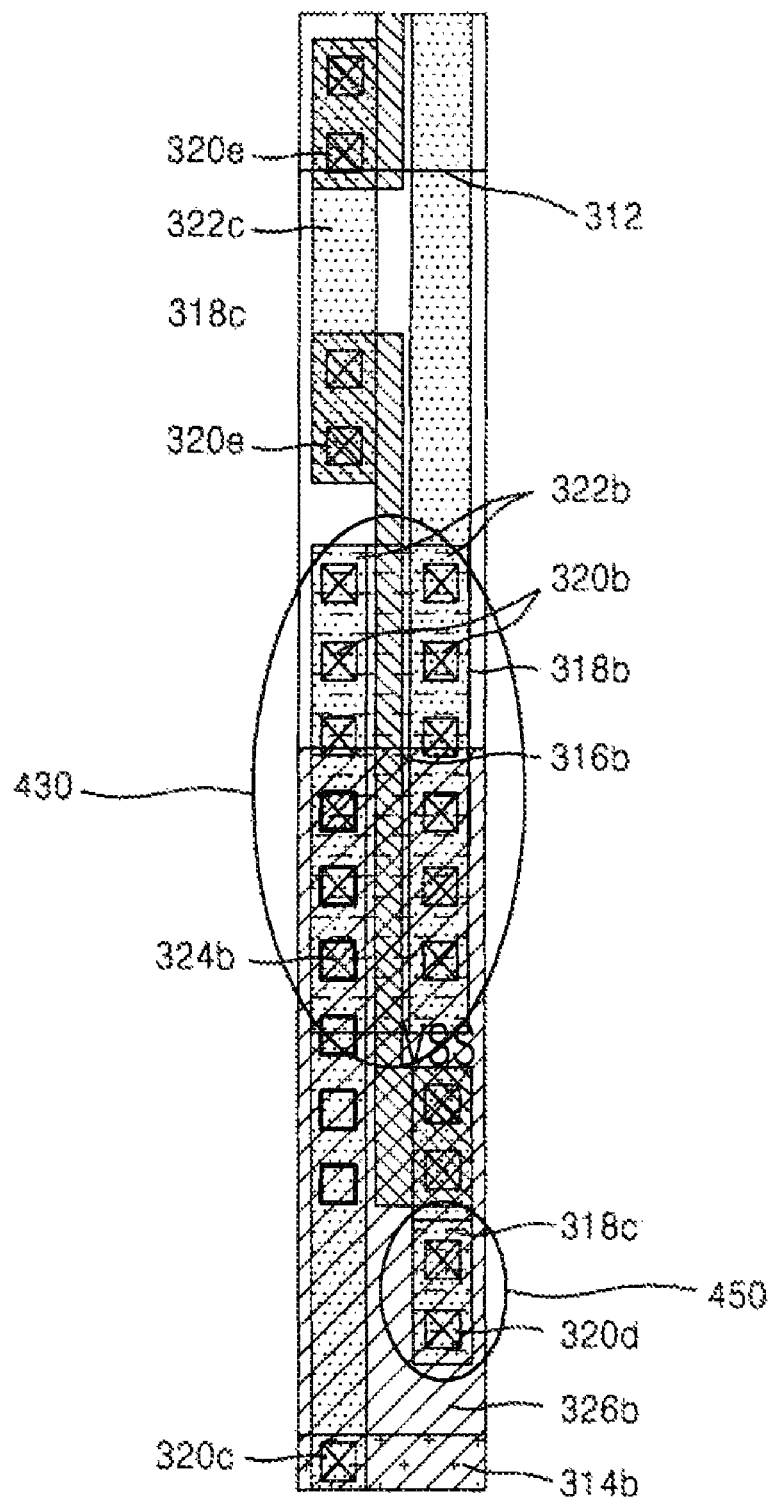
FIG. 4 illustrates a layout method of a junction diode for preventing damage caused by plasma charge according to another embodiment of the present invention.

FIG. 4 illustrates a layout method of a junction diode for preventing damage caused by plasma charge according to another embodiment of the present invention. Comparing the layout method shown in FIG. 4 to that of FIG. 3, a PMOS transistor 410 and an NMOS transistor 430 are disposed close to each other and a junction diode 450 for preventing damage caused by plasma charge is disposed below the NMOS transistor 430. Thus, according to some embodiments, the NMOS transistor 430 may be disposed between the junction diode 450 and the PMOS transistor 410.

Figure 5:
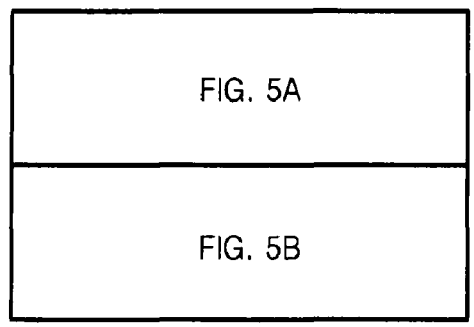
FIG. 5 illustrates a layout method of a junction diode for preventing damage caused by plasma charge according to another embodiment of the present invention.
Figure 5A:
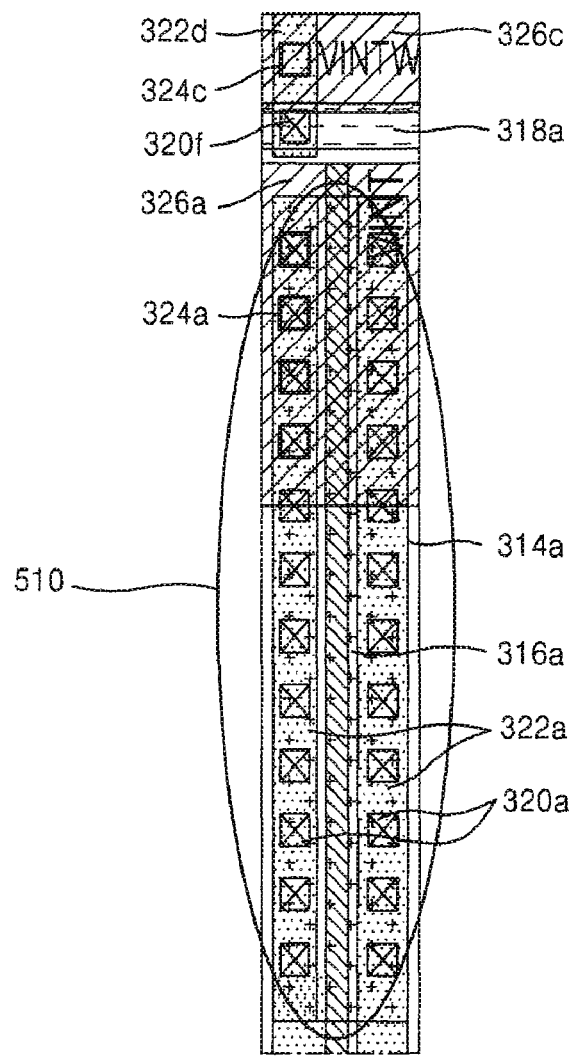
Figure 5B:
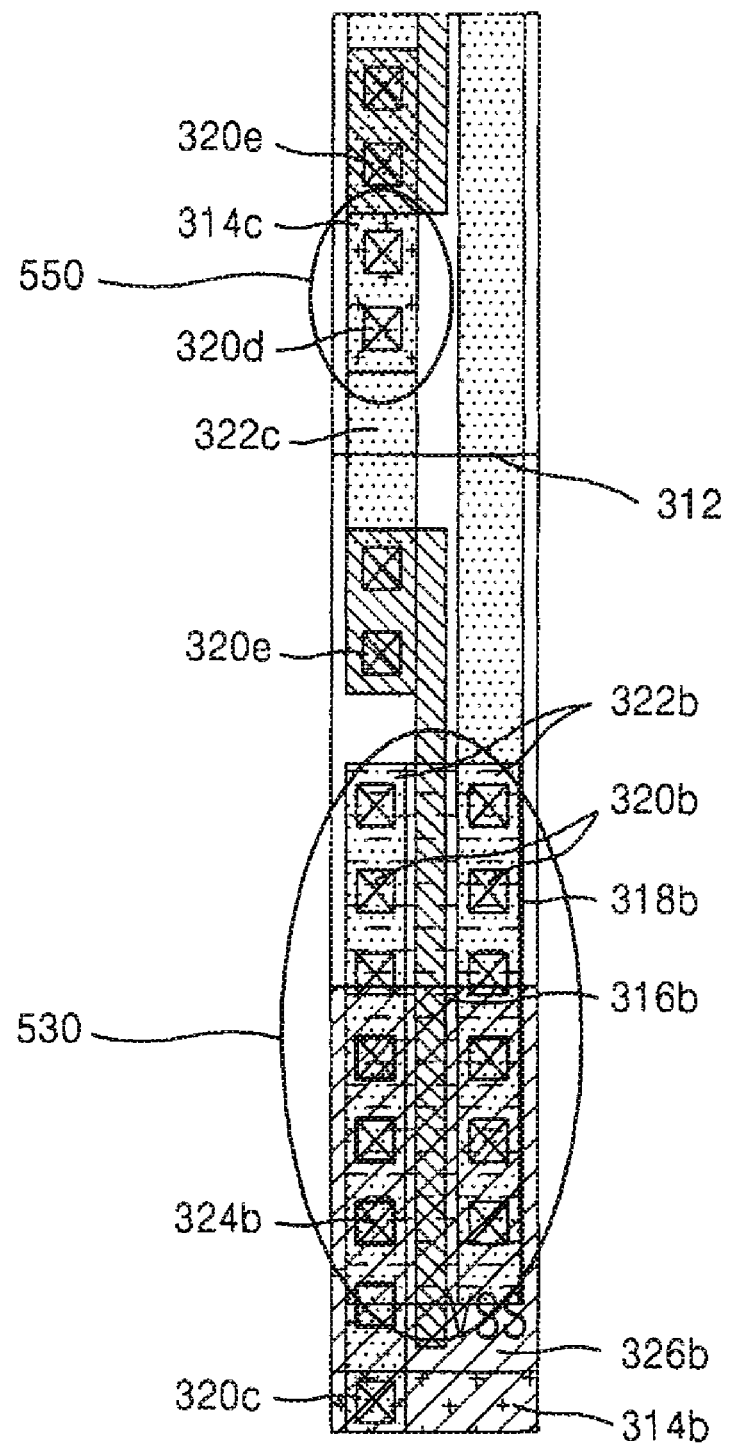

FIG. 5 illustrates a layout method of a junction diode for preventing damage caused by plasma charge according to another embodiment of the present invention. Referring to FIG. 5, a junction diode 550 for preventing damage caused by plasma charge is a PN diode, while the junction diode 350 for preventing damage caused by plasma charge is an NP diode in the layout shown in FIG. 3. In a structure for the junction diode 550 for preventing damage caused by plasma charge, the junction diode 550 connects with the bit poly layer 322c through the contact layer 320e connecting with the gate poly layer 316a in a PMOS transistor 510 and the gate poly layer 316b in an NMOS transistor 530. The bit poly layer 322c connects with a P-active layer 314c through the contact layer 320d. Thus, unlike conventional layout methods, the junction diode 550 is disposed between the NMOS transistor 530 and the PMOS transistor 510.

Figures 6, 6A:
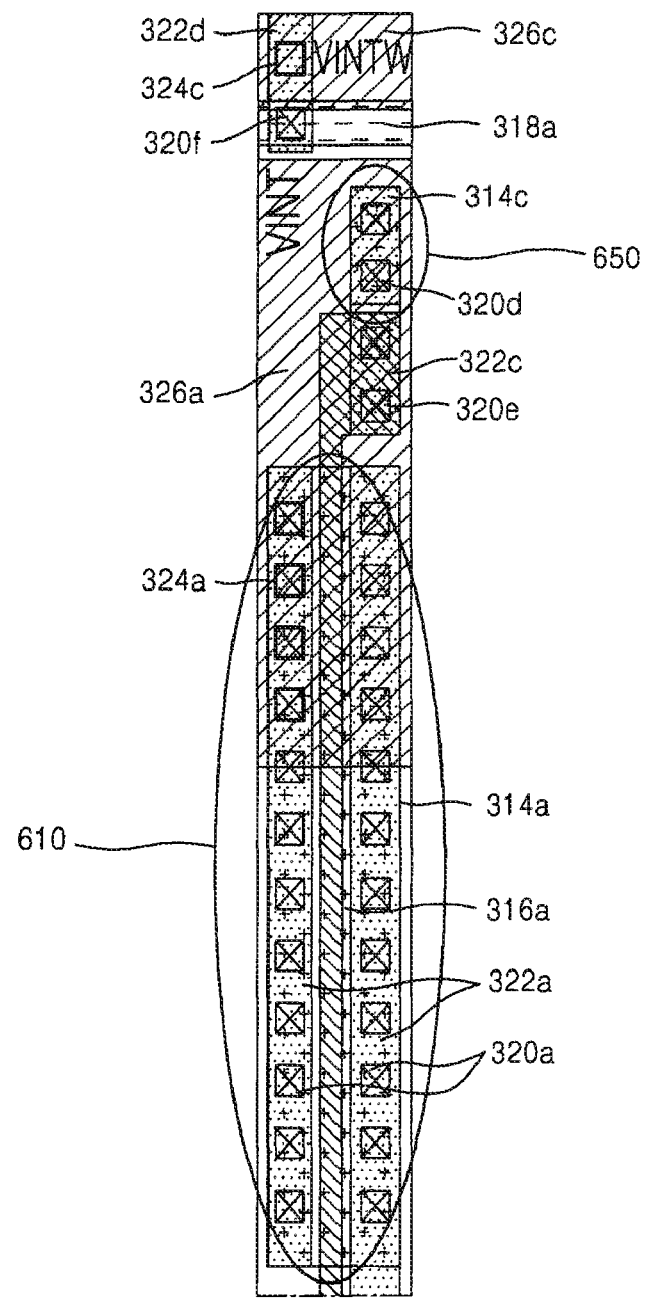
FIG. 6 illustrates a layout method of a junction diode for preventing damage caused by plasma charge according to another embodiment of the present invention.
Figure 6B:
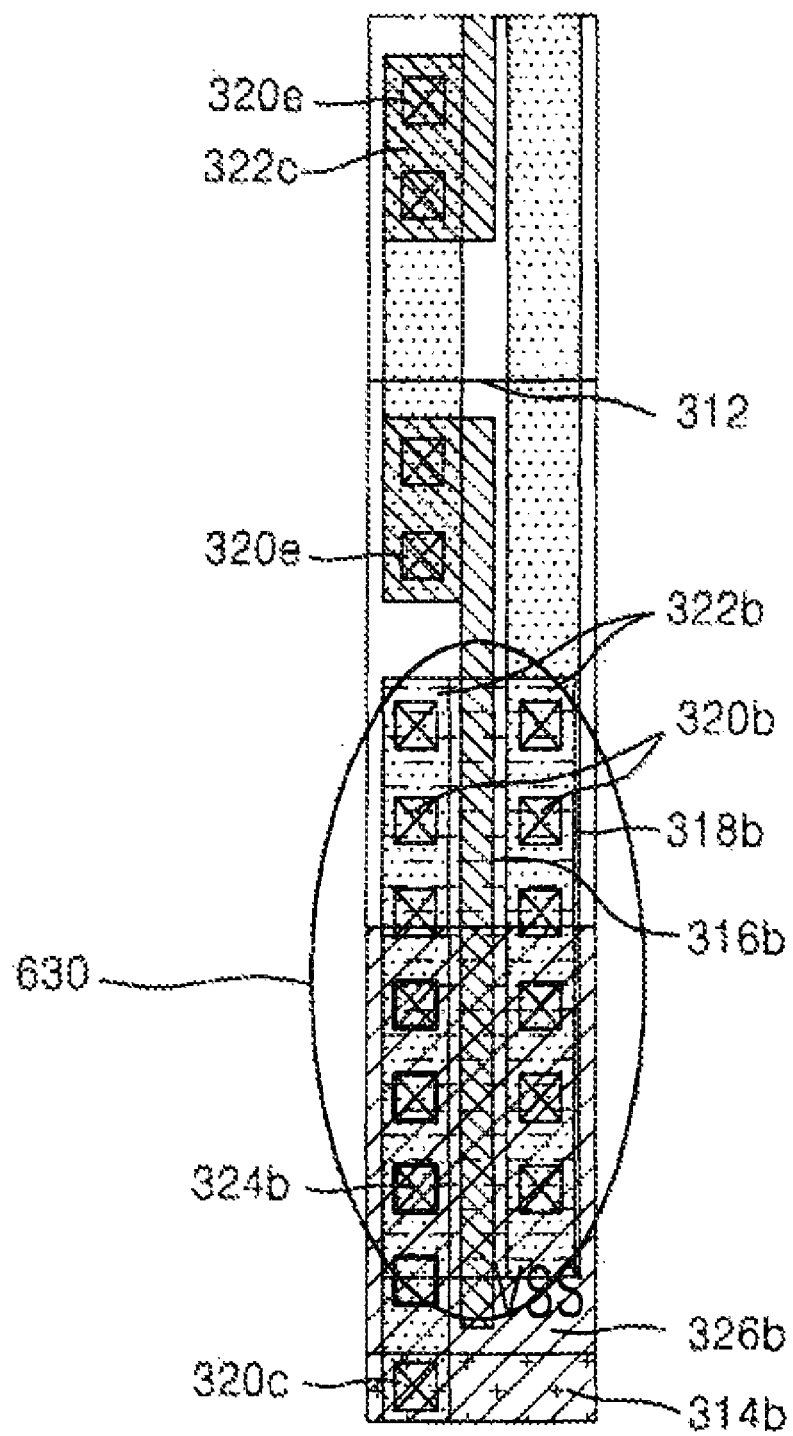

FIG. 6 illustrates a layout method of a junction diode for preventing damage caused by plasma charge according to another embodiment of the present invention. Comparing the layout method shown in FIG. 6 to that of FIG. 5, a PMOS transistor 610 and an NMOS transistor 630 are disposed close to each other and a junction diode 650 for preventing damage caused by plasma charge is disposed above the PMOS transistor 610. Thus, unlike conventional layout methods, the PMOS transistor 610 is disposed between the junction diode 650 and the NMOS transistor 630.

According to an aspect of the present invention, there is provided a layout method for forming a unit layout pattern, the method including: forming an active layer so as to form a plurality of active regions in the unit layout pattern; forming a gate layer so as to form a plurality of gate regions on the active regions; forming a first conductive type doping region in at least one of the plurality of active regions within a well layer where a second conductive type well region is formed so as to form a first conductive type active region; forming a second conductive type doping region in at least one of the plurality of active regions outside of the second conductive type well region so as to form a second conductive type active region; and forming a second conductive type doping region connected with the gate regions so as to form a junction diode in at least one active region between the first and second conductive type active regions, wherein a width of the first and second conductive type active regions is substantially equal to a width of the unit layout pattern.

The layout method may further include the operation of forming a first conductive type doping region so as to form a well guard ring region in at least one of the plurality of active regions within the second conductive type well region at an edge of the unit layout pattern.

The first and second conductive type active regions may form a source region and a drain region, respectively, of a metal-oxide-semiconductor (MOS) transistor.

According to another aspect of the present invention, there is provided a layout method for forming a unit layout pattern, the method including: forming an active layer so as to form a plurality of active regions in the unit layout pattern; forming a gate layer so as to form a plurality of gate regions on the active regions; forming a first conductive type doping region in at least one of the plurality of active regions within a well layer where a second conductive type well region is formed so as to form a first conductive type active region; forming a second conductive type doping region in at least one of the plurality of active regions outside of the second conductive type well region so as to form a second conductive type active region; and disposing a second conductive type doping region connected with the gate region so as to form a junction diode in at least one active region disposed below the second conductive type active region, wherein a width of the first and second conductive type active regions is substantially equal to a width of the unit layout pattern.

According to another aspect of the present invention, there is provided a layout method for forming a unit layout pattern, the method including: forming an active layer so as to form a plurality of active regions in the unit layout pattern; forming a gate layer so as to form a plurality of gate regions on the active regions; forming a first conductive type doping region in at least one of the plurality of active regions within a well layer where a second conductive type well region is formed so as to form a first conductive type active region; forming a second conductive type doping region in at least one of the plurality of active regions outside of the second conductive type well region so as to form a second conductive type active region; and forming a first conductive type doping region connected with the gate regions so as to form a junction diode in at least one active region within the second conductive type well region between the first and second conductive type active regions, wherein a width of the first and second conductive type active regions is substantially equal to a width of the unit layout pattern.

According to another aspect of the present invention, there is provided a layout method for forming a unit layout pattern, the method including: forming an active layer so as to form a plurality of active regions in the unit layout pattern; forming a gate layer so as to form a plurality of gate regions on the active regions; forming a first conductive type doping region in at least one of the plurality of active regions within a well layer where a second conductive type well region is formed so as to form a first conductive type active region; forming a second conductive type doping region in at least one of the plurality of active regions outside of the second conductive type well region so as to form a second conductive type active region; and forming a first conductive type doping region connected with the gate region so as to form a junction diode in at least one active region disposed above the first conductive type active region within the second conductive type well region, wherein a width of the first and second conductive type active regions is substantially equal to a width of the unit layout pattern.

Accordingly, when laying out a unit layout pattern uniformly across a substrate, according to the layout method of the junction diode for preventing damage caused by plasma charge, a dummy gate poly is not required to reduce a step coverage in the gate poly region, since the gate poly region is disposed at regular intervals. Further, the width of the unit layout pattern is substantially equal to the widths of the NMOS and PMOS transistors. Therefore, a layout area can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A layout method for a unit layout pattern, the method comprising:
    forming an active layer so as to form a plurality of active regions in the unit layout pattern;
    forming a gate layer so as to form a plurality of gate regions on the active regions;
    forming a first conductive type doping region in at least one of the plurality of active regions within a well layer where a second conductive type well region is formed so as to form a first conductive type active region;
    forming a second conductive type doping region in at least one of the plurality of active regions outside of the second conductive type well region so as to form a second conductive type active region; and
    forming a first conductive type doping region connected with the gate regions so as to form a junction diode in at least one active region within the second conductive type well region between the first and second conductive type active regions.

2. The layout method of claim 1, further comprising forming a first conductive type doping region so as to form a well guard ring region in at least one of the plurality of active regions within the second conductive type well region at an edge of the unit layout pattern.

3. The layout method of claim 1, wherein the first and second conductive type active regions form a source region and a drain region, respectively, of a metal-oxide-semiconductor (MOS) transistor.

* * * * *